United States Patent
Mönch et al.

(10) Patent No.: US 9,777,894 B2
(45) Date of Patent: Oct. 3, 2017

(54) LUMINAIRE AND METHOD OF PRODUCTION OF A LUMINAIRE

(71) Applicant: OSRAM Opto Semiconductors GmbH, Regensburg (DE)

(72) Inventors: Wolfgang Mönch, Pentling (DE); Thomas Bleicher, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 71 days.

(21) Appl. No.: 14/372,790

(22) PCT Filed: Jan. 17, 2013

(86) PCT No.: PCT/EP2013/050823
§ 371 (c)(1),
(2) Date: Jul. 17, 2014

(87) PCT Pub. No.: WO2013/110540
PCT Pub. Date: Aug. 1, 2013

(65) Prior Publication Data
US 2015/0247608 A1    Sep. 3, 2015

(30) Foreign Application Priority Data
Jan. 24, 2012 (DE) .................. 10 2012 200 973

(51) Int. Cl.
*F21K 99/00* (2016.01)
*H01L 33/00* (2010.01)
(Continued)

(52) U.S. Cl.
CPC .................. *F21K 9/52* (2013.01); *F21K 9/61* (2016.08); *G02B 6/0011* (2013.01); *H01L 33/005* (2013.01); *H01L 33/54* (2013.01); *H01L 33/58* (2013.01); *H01L 25/0753* (2013.01); *H01L 2224/48091* (2013.01); *H01L 2224/73265* (2013.01); *H01L 2933/005* (2013.01)

(58) Field of Classification Search
CPC .................................................. H01L 25/0753
See application file for complete search history.

(56) References Cited

U.S. PATENT DOCUMENTS

| 2007/0034890 A1 | 2/2007 | Daschner et al. | |
| 2009/0039272 A1* | 2/2009 | Krummacher | H01L 27/322 250/370.01 |
| 2009/0225566 A1* | 9/2009 | Zimmermann | G02B 6/0021 362/555 |

FOREIGN PATENT DOCUMENTS

| DE | 102 45 946 C1 | 10/2003 |
| DE | 10 2008 025 923 A1 | 12/2009 |

(Continued)

OTHER PUBLICATIONS

Machine translation of JP2012009632:D1.*
Jacob N. Israelachvili, "Intermolecular & Surface Forces," Academic Press, 2nd Edition, 1991, Chapter 11.4, pp. 183-188.

*Primary Examiner* — Donald Raleigh
*Assistant Examiner* — Jacob R Stern
(74) *Attorney, Agent, or Firm* — DLA Piper LLP (US)

(57) ABSTRACT

A method of producing a partial luminaire includes arranging at least one semiconductor chip that emits electromagnetic radiation on a substrate, and applying an elastic waveguide, disposed downstream of the at least one semiconductor chip in an emission direction, such that the elastic waveguide projects at at least one of its side surfaces beyond the substrate.

20 Claims, 12 Drawing Sheets

(51) Int. Cl.
*H01L 33/58* (2010.01)
*F21V 8/00* (2006.01)
*H01L 33/54* (2010.01)
*F21K 9/61* (2016.01)
*H01L 25/075* (2006.01)

(56) References Cited

FOREIGN PATENT DOCUMENTS

| | | |
|---|---|---|
| DE | 10 2009 005 907 A1 | 7/2010 |
| JP | 2012-009632 A | 1/2012 |
| WO | 2005/081319 A1 | 9/2005 |
| WO | 2006/059828 A1 | 6/2006 |

* cited by examiner

LUMINAIRE AND METHOD OF PRODUCTION OF A LUMINAIRE

TECHNICAL FIELD

This disclosure relates to a partial luminaire and a method of producing a partial luminaire, and to a luminaire and a method of producing a luminaire.

BACKGROUND

Known luminaires can comprise a plurality of partial luminaires for reasons of scalability. In that case, the luminaire can have an inhomogeneous luminance distribution. Thus, there is a need for improvement in luminaires.

SUMMARY

We provide a method of producing a partial luminaire including arranging at least one semiconductor chip that emits electromagnetic radiation on a substrate, and applying an elastic waveguide disposed downstream of the at least one semiconductor chip in an emission direction, such that the elastic waveguide projects at at least one of its side surfaces beyond the substrate.

We also provide a partial luminaire including a substrate, at least one semiconductor chip that emits electromagnetic radiation arranged on the substrate, and an elastic waveguide that intermixes the electromagnetic radiation disposed downstream of the at least one semiconductor chip in an emission direction, wherein the elastic waveguide projects at at least one of its side surfaces beyond the substrate.

We further provide a luminaire including at least two partial luminaires including a substrate, at least one semiconductor chip that emits electromagnetic radiation arranged on the substrate, and an elastic waveguide that intermixes the electromagnetic radiation disposed downstream of the at least one semiconductor chip in an emission direction, wherein the elastic waveguide projects at at least one of its side surfaces beyond the substrate and wherein the elastic waveguides of adjacent partial luminaires are joined to one another without any gaps.

BRIEF DESCRIPTION OF THE DRAWINGS

Various examples are explained in greater detail below with reference to the drawings. Elements that are identical, of identical type or act identically are provided with the same reference signs in the figures. The figures and the size relationships of the elements illustrated in the figures among one another should not be regarded as to scale. Rather, individual elements may be illustrated with an exaggerated large size or reduced size to enable better illustration and to afford a better understanding.

DETAILED DESCRIPTION

Figure 1:
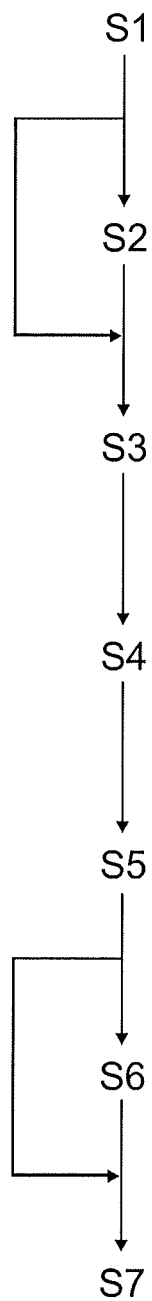
FIG. 1 shows method steps of producing a partial luminaire and a luminaire.

We provide, inter alia, methods of producing partial luminaires. At least one semiconductor chip that emits electromagnetic radiation is arranged on a substrate. An elastic waveguide disposed downstream of the at least one semiconductor chip in the emission direction is subsequently applied such that the elastic waveguide projects at at least one of its side surfaces beyond the substrate. The projection is preferably 10 µm to 100 µm.

Preferably, the step of applying the elastic waveguide comprises a plasma process. For the plasma process, the elastic waveguide produced beforehand, e.g., in a molding process, and the surfaces to which the elastic waveguide is intended to be applied must be free of dust. "Surfaces" mean a layer composed of silicone and/or a scattering layer and/or the emission surface of one or more semiconductor chips. The elastic waveguide and the surfaces are treated with an oxidizing plasma. The surfaces are activated as a result. The elastic waveguide is oriented and joined with the surfaces under moderate pressure. A whole-area, conformal contact occurs between the elastic waveguide and the surfaces. The film of air between the elastic waveguide and the surfaces is displaced. The plasma process is advantageous since a stable connection can be achieved within a few minutes in a simple manner.

Alternatively and preferably, the step of applying the elastic waveguide comprises a molding process. Thus, a mold is filled with liquid silicone. The substrate with the semiconductor chips arranged thereon is subsequently dipped into the liquid silicone such that the semiconductor chips are completely surrounded by liquid silicone. The liquid silicone is subsequently cured by the supply of thermal energy over a number of hours. The silicone contracts somewhat during curing. Therefore, the unit comprising elastic waveguide, potted semiconductor chips and substrate can easily be released from the mold. The mold can be composed of steel and have a Teflon coating. The molding process is advantageous since it enables a very stable connection between the elastic waveguide and the semiconductor chips or the substrate. However, curing the silicone has a duration of a number of hours.

Alternatively and preferably, the step of applying the elastic waveguide comprises an adhesive-bonding process. During the adhesive-bonding process, the elastic waveguide produced beforehand, e.g., in a molding process, can be adhesively bonded onto the abovementioned surfaces using a silicone adhesive. In this case, first, liquid silicone is applied by dispensing to the surfaces to be adhesively bonded. Afterward, the elastic waveguide is emplaced and the silicone adhesive is cured. The adhesive-bonding process is advantageous since it is simple. However, curing the silicone adhesive has a duration of a number of hours.

Preferably, the step of applying the elastic waveguide is preceded by a step of applying a scattering layer to the substrate around the at least one semiconductor chip. The step of applying the scattering layer can be realized by a plasma process or an adhesive-bonding process or a process of applying and curing a scattering potting. Applying a scattering layer is advantageous for the following reasons:

Absorption of the electromagnetic radiation by the substrate can be reduced.

Light emitted by the semiconductor chip at angles not appropriate for the desired emission characteristic of the luminaire or is reflected back from the waveguide onto the substrate can be back-scattered into the elastic waveguide and, subsequently, redistributed and finally leave the waveguide. The use of a scattering layer can also serve for light shaping.

We also provide, inter alia, methods of producing a luminaire composed of a plurality of partial luminaires. First, at least two partial luminaires are provided. The elastic waveguides of adjacent partial luminaires preferably comprise an identical material system. The partial luminaires are arranged with respect to one another such that the elastic waveguides of adjacent partial luminaires touch one another at their side surfaces. The partial luminaires are subsequently pressed onto one another such that the elastic waveguides of adjacent partial luminaires are joined without any gaps. Without any gaps means that the separating locations between elastic waveguides of adjacent partial luminaires disappear. In other words, light rays are neither reflected nor refracted upon the transition from the elastic waveguide of a partial luminaire to the elastic waveguide of an adjacent partial luminaire. Joining without any gaps is based on the physics of wetting phenomena and thin fluid films. A thin fluid film (composed of gas or liquid) enclosed between two bodies becomes thinner over time and finally disappears completely. A prerequisite for this is that the two bodies are identical material systems. The physics underlying the mechanism of joining without any gaps is described in "Jacob N. Israelachvili: Intermolecular and Surface Forces, Academic Press, 2nd ed., 1991," the subject matter of which is incorporated herein by reference.

Preferably, the partial luminaires are pressed onto one another at a lateral pressure of at most 100 Pa. This is advantageous since such a low pressure is simple to realize in terms of process engineering. Even this low pressure suffices to "force away" projections of 10 μm to 100 μm of elastic waveguides adjoining one another and enable joining without any gaps. A pressure that is as low as possible must be chosen such that the (undesired) stress exerted on the elastic waveguides of the partial luminaires and on further interfaces (e.g., between semiconductor chips and scattering layer) is as low as possible. The "movement toward one another" of the partial luminaires ends when the substrates of adjacent partial luminaires touch one another.

Preferably, the lateral pressure is exerted on the partial luminaires during 10 ms to 10 s. Even such a short time period suffices to join the elastic waveguides of adjacent partial luminaires without any gaps.

The process of joining without any gaps must be carried out at a temperature which lies above the so-called "glass transition point" of the polysiloxanes used in the elastic waveguides.

Joining without any gaps may be carried out without the use of an adhesion promoter between the elastic waveguides of adjacent partial luminaires. The elastic waveguides of adjacent partial luminaires, therefore, connect to one another in a manner free of adhesion promoter.

Preferably, the partial luminaires are arranged on a carrier by that side of the substrate situated opposite the elastic waveguide, before the partial luminaires are pressed onto one another. This is advantageous since the use of a carrier ensures that the elastic waveguides of adjacent partial luminaires can be arranged flush with respect to one another. Moreover, the carrier significantly increases the stability of the luminaire.

We also provide, inter alia, a partial luminaire. The partial luminaire comprises at least one semiconductor chip that emits electromagnetic radiation and is arranged on a substrate. An elastic waveguide to intermix the electromagnetic radiation is disposed downstream of the at least one semiconductor chip in the emission direction. The elastic waveguide has at at least one of its side surfaces a projection beyond the substrate of approximately 10 μm to approximately 100 μm. This projection is absolutely necessary join elastic waveguides of adjacent partial luminaires without any gaps.

Preferably, the projecting side surface of the elastic waveguide forms an angle of approximately 80° to approximately 100°, preferably approximately 85° to approximately 95°, particularly preferably approximately 90°, with a main extension direction of the substrate. This angle is advantageous since the side surfaces of adjacent elastic waveguides can thereby come completely into contact with one another.

Preferably, the elastic waveguide comprises crosslinked poly(organo)siloxanes, polysiloxanes for short, or silicones. The crosslinking takes place during curing of the liquid polysiloxanes. Crosslinked polysiloxanes are advantageous for use in elastic waveguides since they are simultaneously highly transparent (transmittance of 98% to 99%), elastic, shapable, dimensionally stable, UV-stable and thermally stable. What is particularly advantageous is the contour accuracy, in other words the molding accuracy, even for structures in the nanometers range. In other words, if a master structure is molded with silicone elastomers, master and molded structure correspond with nanometer accuracy.

Preferably, the polysiloxanes have a modulus of elasticity of 0.2 MPa to 100 MPa, preferably 0.5 MPa to 15 MPa. Polysiloxanes having the abovementioned values of the modulus of elasticity are advantageous since they are suitable for joining elastic waveguides without any gaps. Elastic waveguides having such a high elasticity are suitable to conformally nestle against one another, which is a necessary prerequisite for joining without any gaps. These elastic waveguides also tolerate a certain undulation of their side surfaces during the process of joining the waveguides of adjacent partial luminaires.

Preferably, the polysiloxanes comprise at least one of the following materials:
polydimethylsiloxane
polydiethylsiloxane
polyethylmethylsiloxane.

These materials are advantageous since they are particularly well suited to joining without any gaps.

Preferably, the substrate of the partial luminaire is flexible. Particularly preferably, the substrate comprises polyimide (PI). Flexible substrates are advantageous since they are suitable for shaping the partial luminaire onto three-dimensional structures, e.g., advertising columns. Moreover, partial luminaires comprising flexible substrates are suitable for use in rollable so-called "E-papers."

Preferably, the elastic waveguide comprises an inflexible core, in particular composed of glass, PMMA (polymethyl methacrylate), PC (polycarbonate) or COC (cycloolefin copolymers), the core being coated with polysiloxanes at least at its side surfaces. The modulus of elasticity of the polysiloxanes can be 0.2 MPa to 100 MPa, preferably 0.5 MPa to 15 MPa. The combination of inflexible core and elastic coating with polysiloxanes is advantageous since the elastic waveguide is simultaneously rigid and joinable without any gaps.

We further provide, inter alia, luminaires. The luminaires comprise at least two partial luminaires, the elastic waveguides of which are joined to one another without any gaps. In particular, the elastic waveguides of the at least two partial luminaires are connected to one another in a manner free of adhesion promoter. This is particularly advantageous since luminaires of a wide variety of shapes and sizes can be produced by the combination of partial luminaires. In this regard, by way of example, luminaires having a square or rectangular shape can be produced from the same partial luminaires. The underlying partial luminaires can have a square, rectangular, hexagonal or some other area-filling shape.

Preferably, the partial luminaires are arranged on a carrier for the purpose of affixing. This is advantageous since the carrier stabilizes the luminaire. Alternatively, the carrier could be dispensed with by the substrates of adjacent partial luminaires being mechanically stably connected to one another. By way of example, adjacent substrates can be adhesively bonded and/or screwed to one another.

Preferably, the substrate comprises one of the following elements:
  a printed circuit board (PCB),
  a ceramic substrate,
  a metal-core circuit board,
  a leadframe or
  a plastic laminate.

The semiconductor chips comprise at least one active zone which emits electromagnetic radiation. The active zones can be pn junctions, double heterostructure, multi quantum well structure (MQW), single quantum well structure (SQW). Quantum well structure means: quantum wells (3-dim), quantum wires (2-dim) and quantum dots (1-dim).

Preferably, the semiconductor chip is based on a III-V compound semiconductor material. III-V compound semiconductor materials are advantageous since high internal quantum efficiencies can be achieved during the generation of radiation. Preferably, the semiconductor chip can comprise aluminum indium gallium nitride ($Al_xIn_yGa_{1-x-y}N$). These semiconductor chips can emit electromagnetic radiation from the ultraviolet spectral range through the blue spectral range to the green spectral range. Further preferably, the semiconductor chip can comprise aluminum indium gallium phosphide ($Al_xIn_yGa_{1-x-y}P$). These semiconductor chips can emit electromagnetic radiation from the red spectral range to the yellow spectral range. Here $0 \leq x \leq 1$, $0 \leq y \leq 1$ and $x+y \leq 1$ in each case, in particular where $x \neq 1$, $y \neq 1$, $x \neq 0$ and/or $y \neq 0$.

Preferably, the semiconductor chip can be embodied as a surface emitter, in particular as a so-called "thin-film chip." Emission in a forward direction is predominant in thin-film chips. The thin-film chip is known from WO 2005 081319 A1, for example. Alternatively, the semiconductor chip can also be a so-called "volume emitter" in which the growth substrate composed of sapphire remains at the epitaxial layers.

Contact can be made with the semiconductor chips by wire bonding. In the case of light-emitting semiconductor chips comprising a layer having an n-polarity and a layer having a p-polarity, contact can be made with one of the two layers via a bonding wire. Alternatively, contact can be made with both layers by a respective bonding wire. The bonding wire connects a bonding pad on the carrier and a contact pad on the light-emitting semiconductor chip. Given a minimum diameter of approximately 15 µm, the bonding wire attains an absolute height above the semiconductor chip of at least approximately 70 µm.

Preferably, the contacts of the layer having the n-polarity and of the layer having the p-polarity are realized on that side of the semiconductor chip facing the substrate. One example is a so-called "flip-chip arrangement." The absence of contact structures on the radiation emission side of the semiconductor chip is particularly advantageous since the elastic waveguide can be arranged directly on the radiation emission side of the semiconductor chips.

Preferably, a conversion element is arranged between the radiation emission side of the semiconductor chips and the elastic waveguide. This is particularly advantageous for the wavelength conversion of the light emitted by the semiconductor chip. The conversion element can have a thickness of approximately 20 µm to approximately 200 µm. The conversion element comprises phosphor particles. The phosphor particles convert part of the short-wave electromagnetic radiation (e.g., blue light) emitted by the semiconductor chip into longer-wave electromagnetic radiation (e.g., yellow light). The mixed light comprising blue and yellow light can produce white light.

The phosphor particles comprise at least one of the following materials:
  lanthanum-doped yttrium oxide ($Y_2O_3$—$La_2O_3$),
  yttrium aluminum garnet ($Y_3Al_5O_{12}$),
  dysprosium oxide ($Dy_2O_3$),
  aluminum oxynitride ($Al_{23}O_{27}N_5$) or
  aluminum nitride (AlN).

The conversion element can be a ceramic lamina having a thickness of approximately 40 µm to approximately 200 µm, preferably having a thickness of approximately 100 µm. Alternatively, the conversion element can be a silicone lamina having a thickness of approximately 20 µm to approximately 30 µm. Alternatively, the conversion element can be deposited electrophoretically with a thickness of approximately 50 µm to approximately 100 µm. Alternatively, the conversion element can be molded onto the semiconductor chip with silicone as molding material into which phosphor particles are embedded.

The scattering layer comprises a matrix material into which scattering particles are introduced. The scattering particles occur in a concentration of 5 percent by weight to 60 percent by weight. The matrix material can comprise silicone, epoxy resin or hybrid materials. The scattering particles comprise at least one of the following materials:
  titanium dioxide ($TiO_2$),
  aluminum oxide ($Al_2O_3$),
  zirconium oxide (ZrO) and/or
  barium fluoride ($BaF_2$).

The scattering layer can at least partly cover the substrate, the side surfaces of the semiconductor chips and the side surfaces of the conversion elements. What is achieved by this scattering layer is that at least part of the light emerging laterally from the conversion elements is reflected back into the conversion elements. The undesired absorption of the light by adjacent semiconductor chips or by the substrate is also reduced.

Preferably, that surface of the elastic waveguide facing away from the substrate is provided with a refractive microstructure. Such a microstructure is advantageous since, as a result, the coupling-out of light from the elastic waveguide can be improved and the light intensity distribution curve of the light emitted by the luminaire can be shaped. The refractive microstructure can either be produced together with the elastic waveguide directly during production (e.g., during the molding of the elastic waveguide) or placed subsequently onto the elastic waveguide as a separate optical element. This separate optical element can be a plate composed of PMMA, into which arrays of microcones are introduced. Such a plate composed of PMMA can have a thickness in the mm range, for example, a thickness of approximately 3 mm.

The refractive microstructure can have pyramids or cones as structure element, which are arranged on the emission side of the elastic waveguide.

The refractive microstructure in respectively on the elastic waveguide can bring about light shaping in conjunction with the scattering layer (between elastic waveguide and substrate). Instead of a Lambertian emission, it is thus possible to achieve an emission preferably into small angles (relative to the plane of the waveguide). This is advantageous to be able to comply with the legal glare criteria in a lighting situation with the luminaire described here and to include them in planning already at the luminaire level. A further advantage of the combination of scattering layer and refractive microstructure is the higher efficiency of such luminaires in comparison with luminaires without a scattering layer.

All of the features described for the partial luminaire, and for the luminaire, are also disclosed for the respective production method, and vice versa.

The technical outlay to equip a partial luminaire, which is small compared to the luminaire, with semiconductor chips is considerably lower than when equipping the luminaire. The reason is the smaller travel distances and the less stringent requirements in respect of the complexity of the automatic placement machines.

As a result of the modular construction from partial luminaires, the luminaires are scalable in virtually any desired fashion. By combining a plurality of identical partial luminaires, it is possible to obtain different larger luminaire formats.

FIG. 1 shows method steps of producing a partial luminaire and a luminaire.

In a first step S1, at least one semiconductor chip that emits electromagnetic radiation is arranged on a substrate.

In an optional step S2, a scattering layer is applied on the substrate around the at least one semiconductor chip. A scattering film can be used as the scattering layer. The scattering film can also be designated as a functional optical film and can comprise silicone, for example, into which $TiO_2$ particles are introduced. Holes for the semiconductor chips are stamped out in the scattering film. The scattering film is applied by a plasma process or an adhesive-bonding process. The gaps between the semiconductor chips and the scattering film and the sidewalls of the semiconductor chips can be covered with a scattering potting. As an alternative to the scattering film, the scattering layer can be applied by a process of applying and curing a scattering potting.

In a step S3, an elastic waveguide disposed downstream of the at least one semiconductor chip in the emission direction is applied by a plasma process or a molding process or an adhesive-bonding process. In this case, the elastic waveguide is applied such that it projects at at least one of its side surfaces beyond the substrate. The projection can be approximately 10 µm to approximately 100 µm.

Figure 2A:
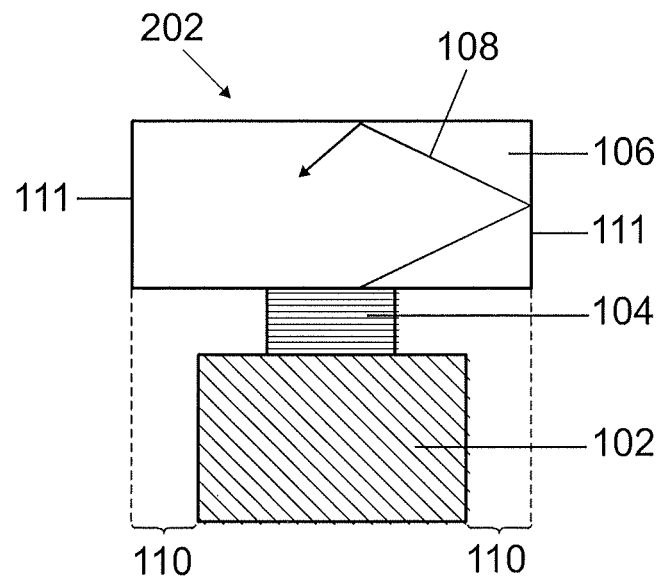
FIG. 2a shows a first example of a partial luminaire in sectional view.
Figure 3A:
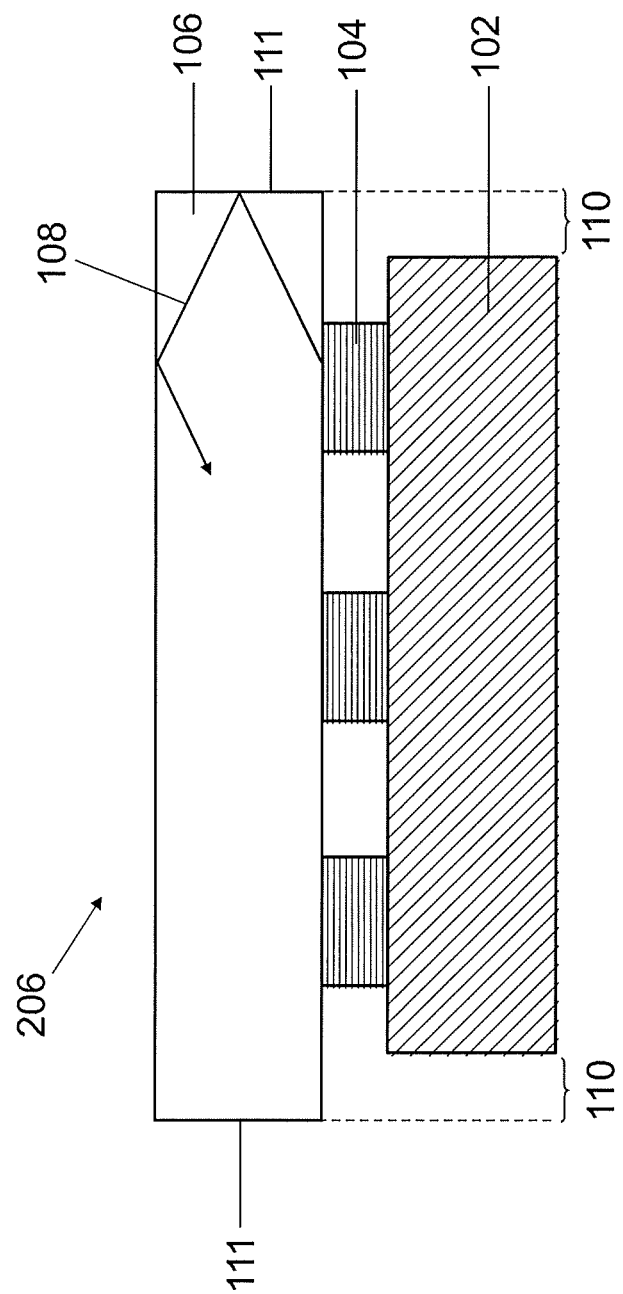
FIG. 3a shows a third example of a partial luminaire in sectional view.

The result of method steps S1 and S3 is a partial luminaire, illustrated in the examples according to FIGS. 2a and 3a.

Figure 2B:
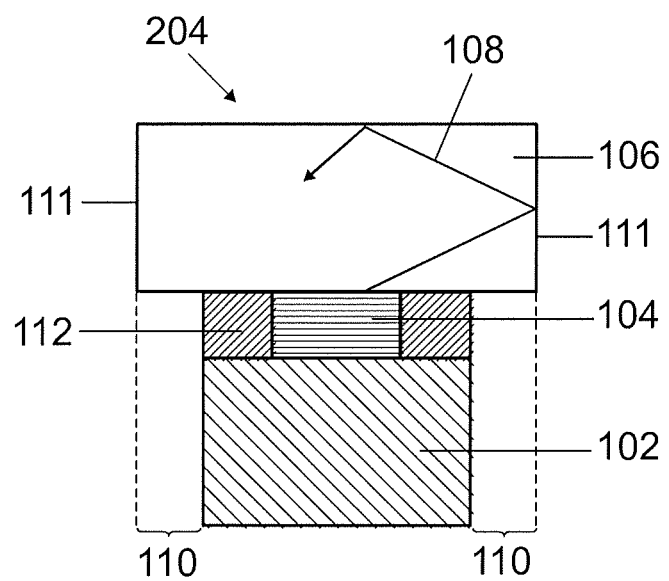
FIG. 2b shows a second example of a partial luminaire in sectional view.
Figure 3B:
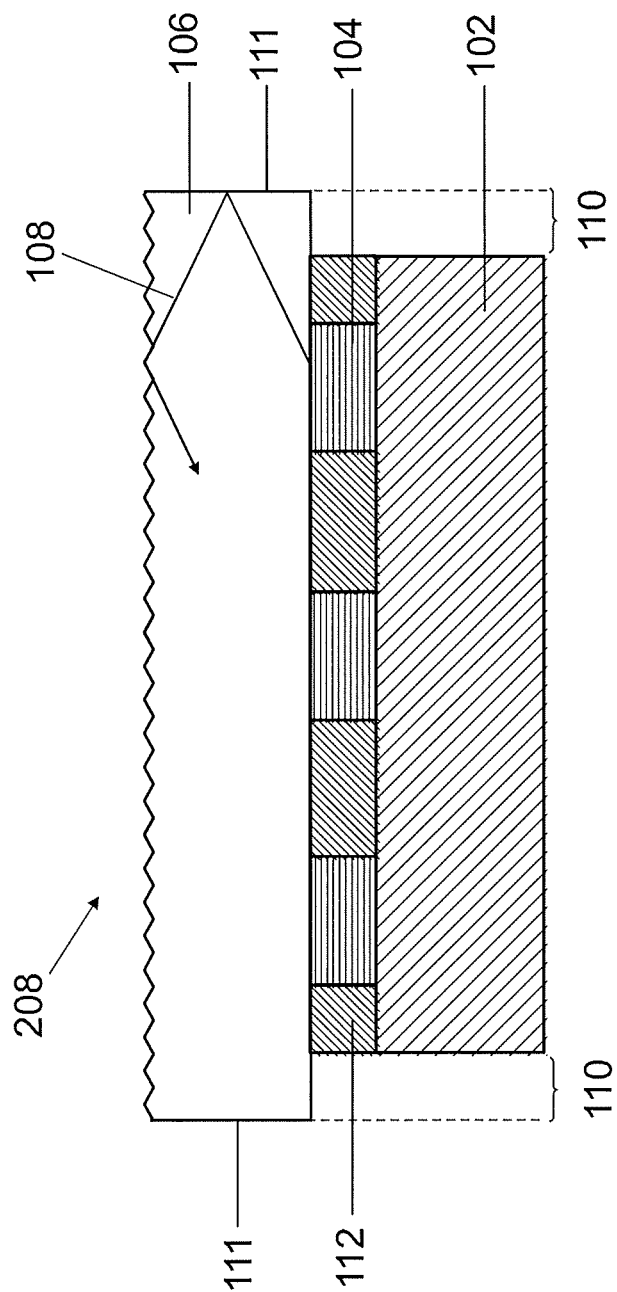
FIG. 3b shows a fourth example of a partial luminaire in sectional view.

The result of method steps S1, S2 and S3 is a partial luminaire, illustrated in the examples according to FIGS. 2b and 3b.

In a step S4, at least two partial luminaires are provided, wherein the elastic waveguides of adjacent partial luminaires preferably comprise an identical material system.

In a step S5, the partial luminaires are arranged such that the elastic waveguides of adjacent partial luminaires touch one another at their side surfaces.

In an optional step S6, the partial luminaires are arranged on a carrier by that side of the substrate which is situated opposite the elastic waveguide. The carrier can be a thin inflexible metal plate.

In a step S7, the partial luminaires are pressed onto one another such that the elastic waveguides of adjacent partial luminaires are joined without any gaps. In particular, the elastic waveguides connect to one another without an adhesion promoter. The process of pressing onto one another is preferably carried out for a duration of 10 ms to 10 s at a lateral pressure of at most 100 Pa. A further boundary condition of the joining process is the temperature. Elastic waveguides generally comprise silicones. Joining without any gaps is only possible if the silicones are above their glass transition point. It is only then that the modulus of elasticity of the silicones is low enough, in other words: it is only then that the silicones are soft enough.

The result of method steps S4, S5, S6 and S7 is a luminaire, produced from two or more partial luminaires. The luminaires are illustrated in the examples in FIGS. 5-9.

FIG. 2a shows a first example of a partial luminaire 202 in sectional view. A semiconductor chip 104 that emits electromagnetic radiation is arranged on a substrate 102. The substrate 102 can be, for example, a substantially rigid structure such as a printed circuit board (PCB), a ceramic substrate or a metal-core circuit board. Alternatively, the substrate 102 can be flexible and comprise polyimides (PI), in particular. An elastic waveguide 106 to intermix the electromagnetic radiation is disposed downstream of the semiconductor chip 104 in the emission direction. The elastic waveguide 106 has at its side surfaces 111 a projection 110 beyond the substrate 102 of approximately 10 µm to approximately 100 µm. The side surfaces 111 of the elastic waveguide 106 are at an angle of approximately 80° to approximately 100°, preferably approximately 85° to approximately 95°, particularly preferably at an angle of approximately 90°, relative to a main extension direction of the substrate 102.

The elastic waveguide 106 comprises crosslinked poly(organo)siloxanes, polysiloxanes for short, or silicones. The polysiloxanes suitable for joining without any gaps have a modulus of elasticity of 0.2 MPa to 100 MPa, preferably 0.5 MPa to 15 MPa. The polysiloxanes can comprise at least one of the following materials:

polydimethylsiloxane
polydiethylsiloxane
polyethylmethylsiloxane.

Relevant data of two types of silicone shall be mentioned by way of example.

Low refractive index or LRI silicone having a refractive index of 1.41 to 1.43 has, in a temperature range of −40° C. to 100° C., a substantially constant modulus of elasticity of approximately 2 MPa (−40° C.~2.53 MPa; +25° C.~2.05 MPa; +100° C.~2.54 MPa). LRI silicone is therefore advantageous since it can be used for the process of joining without any gaps at all temperatures relevant in practice.

High refractive index or HRI silicone having a refractive index of n=1.52 to n=1.58 has a greatly temperature-dependent modulus of elasticity (−40° C.~1560 MPa; +25° C.~10.2 MPa; +100° C.~3.0 MPa), for which reason it can be used for the process of joining without any gaps only above room temperature. However, HRI silicone can be advantageous owing to its higher refractive index in comparison with LRI silicone. Since the difference in refractive index between HRI silicone and the semiconductor chips 104 ($n_{AlInGaN}$=2.4-2.5; $n_{AlInGaP}$=3.2-3.3) is smaller than that between LRI silicone and the semiconductor chips 104, more light from the semiconductor chips 104 can be coupled into the elastic waveguide 106 if the elastic waveguide 106 comprises HRI silicone. A prerequisite for this, however, is that the semiconductor chips 104 directly adjoin the elastic waveguide 106.

The semiconductor chip 104 can be based on the aluminum indium gallium nitride (AlInGaN) material system and emit electromagnetic radiation, in particular light, of one color, for example, blue or green light.

The semiconductor chip 104 can be based on the aluminum indium gallium phosphide (AlInGaP) material system and emit electromagnetic radiation, in particular light, of one color, for example, red or yellow light.

A conversion element (not shown in FIG. 2a) can be applied on a semiconductor chip 104 that emits in the blue spectral range, which conversion element converts part of the blue light into yellow light. The mixed light comprising blue and yellow light can produce white light. In other words, the partial luminaire can be designed as a white light source.

The elastic waveguide 106 can be connected to the semiconductor chip 104, for example, by a light-transmissive adhesive layer (not shown in FIG. 2a), in particular composed of silicone.

One possible light path 108 is illustrated. One part of the light emitted by the semiconductor chip 104 is reflected by total internal reflection inter alia at the side surfaces 111 of the elastic waveguide 106.

FIG. 2b shows a second example of a partial luminaire 204 in sectional view. This example differs from the example in FIG. 2a solely by a scattering layer 112. The scattering layer 112 completely encloses the semiconductor chip 104 at its four side surfaces. The scattering layer 112 can consist of a matrix material composed of silicone, for example, into which titanium dioxide particles as scattering particles are introduced.

FIG. 3a shows a third example of a partial luminaire 206 in sectional view. Three semiconductor chips 104 are visible in this view. The semiconductor chips 104 can emit light of one color, for example. Alternatively, red, green and blue semiconductor chips 104 can simultaneously be provided, the light from which can be mixed to form white light in the elastic waveguide 106. To intensify the light mixing effect, scattering particles (not shown in FIG. 3a) composed, in particular, of $TiO_2$ can be introduced into the elastic waveguide 106. By way of example, the thickness of the elastic waveguide 106 can correspond approximately to the distance between adjacent semiconductor chips 104. The thickness of the elastic waveguide 106 can be approximately 1 mm to approximately 20 mm. By way of example, a thin elastic waveguide 106 can be advantageous since heat can then be dissipated from the semiconductor chip 104 via the waveguide 106. In other words, passive cooling is possible. The lower limit of approximately 1 mm arises by virtue of the fact that sufficient edge definition of the elastic waveguide 106 must still be provided.

The partial luminaire 206 must not be too small such that the number of joining processes required when joining the partial luminaires together to form a luminaire is not too great. On the other hand, the partial luminaire must also not be too large such that the process of equipping with semiconductor chips 104 does not become too complex. Otherwise, the example in FIG. 3a corresponds to the example in FIG. 2a.

FIG. 3b shows a fourth example of a partial luminaire 208. A scattering layer 112 completely encloses the semiconductor chips 104 at their four side surfaces. The elastic waveguide 106 can be fixed on the semiconductor chips 104 and/or on the scattering layer 112, for example, by adhesive bonding. The surface of the elastic waveguide 106 can be structured to increase the coupling-out efficiency. The structuring can comprise structure elements in the millimeters range which have approximately pyramidal or conical shape. Moreover, further structures in the μm and/or nm range can be provided on the surface, which further increase the coupling-out efficiency. Otherwise, the example in FIG. 3b corresponds to the example in FIG. 3a.

Figure 3C:
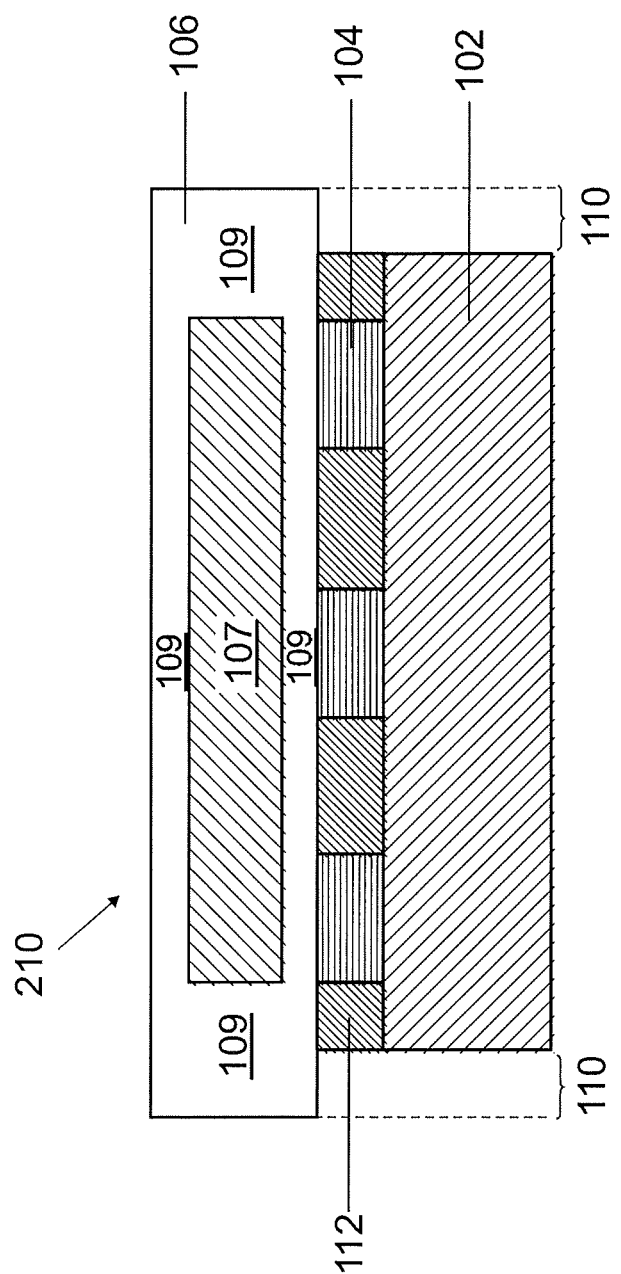
FIG. 3c shows a fifth example of a partial luminaire in sectional view.

FIG. 3 shows a fifth example of a partial luminaire 210 in sectional view. The elastic waveguide 106 comprises an inflexible core 107. The core 107 comprises, for example, glass, PMMA (polymethyl methacrylate), PC (polycarbonate) or COC (cycloolefin copolymers). The core 107 is provided with a coating 109 composed of polysiloxanes, for example. The modulus of elasticity of the coating 109 can be 0.2 MPa to 100 MPa, preferably 0.5 MPa to 15 MPa. In an example which is not shown, only the side surfaces of the core 107 are provided with a coating 109. The substrate 102 projects laterally beyond the core 107 such that, when the adjacent partial luminaires 210 are pressed together, the elastic waveguides 106 have a sufficient lateral compressibility. Otherwise, the example in FIG. 3c corresponds to the example in FIG. 3b.

Two types of semiconductor chips with associated electrical contacts which can be used in the examples in accordance with FIGS. 2a, 2b, 3a, 3b, 3c, 5, 6, 7, 8 and 9 are schematically illustrated by way of example below with reference to FIGS. 4a and 4b.

Figure 4A:
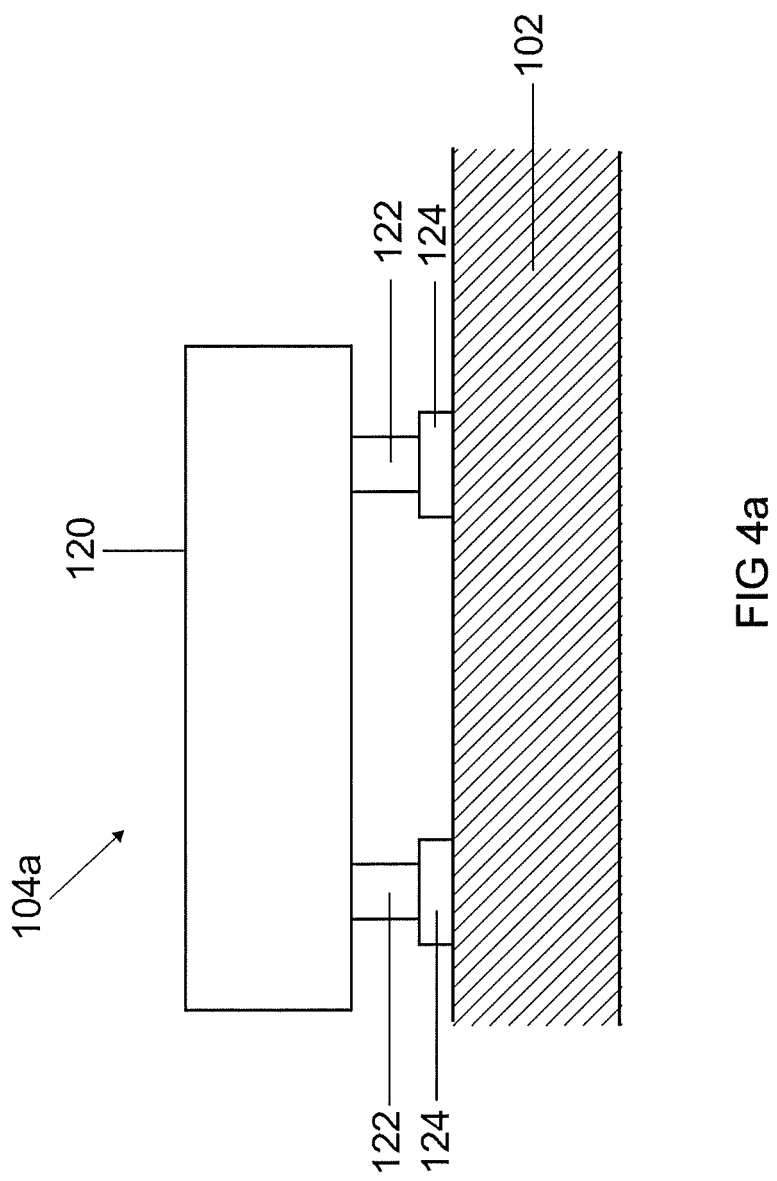
FIG. 4a shows a semiconductor chip having electrical contacts in sectional view.

FIG. 4a shows a semiconductor chip 104a in sectional view, in which semiconductor chip the radiation emission side 120 is free of contacts. Both electrical contacts are realized on that side of the semiconductor chip 104a facing the substrate 102. Losses of luminance as a result of shading can thus be avoided. The two chip contacts 122 of the semiconductor chip 104a are arranged on that side of the semiconductor chip 104a facing the substrate 102. Two bonding pads 124 are provided on the substrate 102 for the linking of the semiconductor chip 104a. The chip contacts 122 and the bonding pads 124 can connect to one another by solder. One possible example of such a semiconductor chip 104a is the so-called "flip-chip."

Figure 4B:
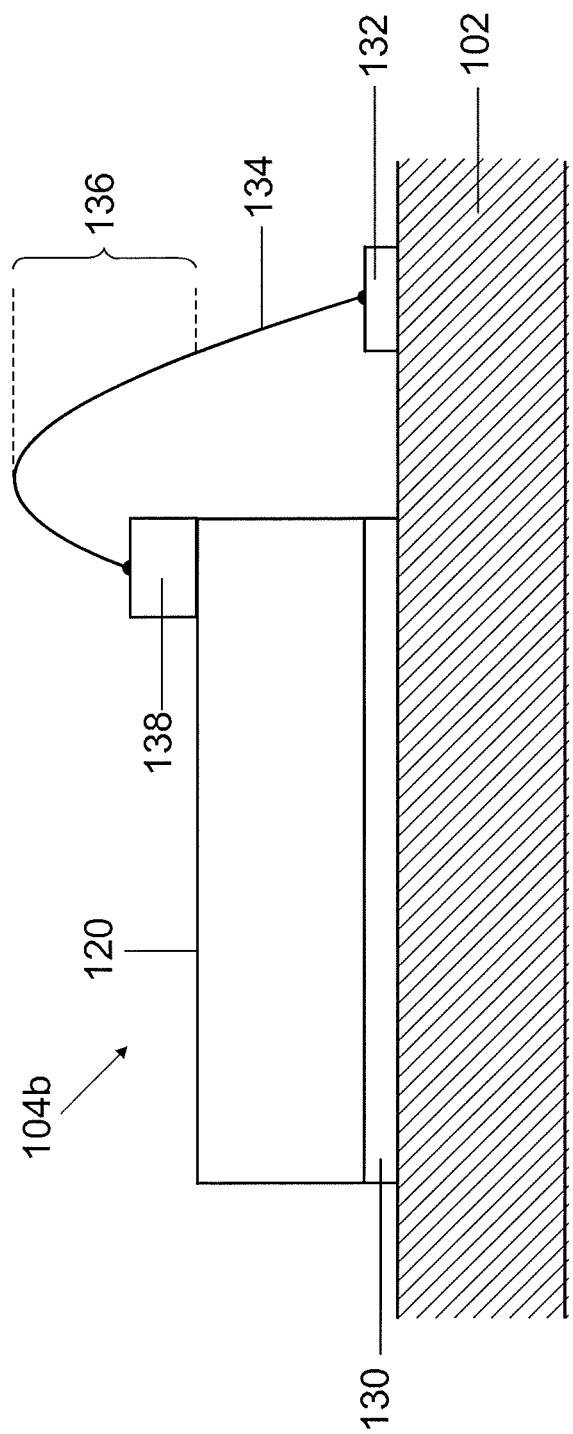
FIG. 4b shows a semiconductor chip having electrical contacts in sectional view.

FIG. 4b shows a semiconductor chip 104b in sectional view, in which semiconductor chip one of the two electrical contacts is arranged on the radiation emission side 120 of the semiconductor chip 104b. The semiconductor chip 104b electrically and mechanically connects to the substrate 102 via a semiconductor chip contact layer 130. The second electrical contact of the semiconductor chip 104b is realized by a bonding wire 134. The bonding wire 134 has a diameter of at least 15 μm. The bonding wire 136 connects the bonding pad 132 on the carrier 102 to the contact pad 138 on the radiation emission side 120 of the semiconductor chip 104b. Bonding wire 134, bonding pad 132 and contact pad 138 can comprise gold. The contact pad 138 and the bonding pad 132 can have thicknesses of 0.5 μm to 5 μm. The bonding wire 134 has a bend, the so-called "loop." The height 136 of the loop above the semiconductor chip 104b is at least approximately 70 µm. To prevent the bonding wire 134 from coming into contact with an elastic waveguide 106 (not illustrated in FIG. 4b) arranged downstream and from being damaged in the process, a spacer (not illustrated in FIG. 4b) can be provided which projects above the loop. The spacer must have a thickness of more than 70 µm, for example. The spacer is, for example, a conversion element 150 (not illustrated in FIG. 4b).

However, it is also possible to use any other type of semiconductor chip with any desired contact-making methods in the partial luminaires.

In all types of optoelectronic semiconductor chips, the radiation emission side 120 of the semiconductor chips 104 can be roughened. Pyramidal structures can serve as a roughening. The pyramids can have a height of between 0.5 µm and 4 µm. As a result of the roughening, the proportion of the radiation subjected to total internal reflection at the interface between semiconductor chip and surroundings is significantly reduced. In other words, the coupling-out efficiency of the semiconductor chip is significantly increased by the roughening. The roughened semiconductor chips 104 can be covered with a thin silicone layer. The silicone layer facilitates the subsequent joining of the elastic waveguide onto the semiconductor chips 104. For the sake of clarity, however, the roughening and the silicone layer are not illustrated in the figures.

Figure 5:
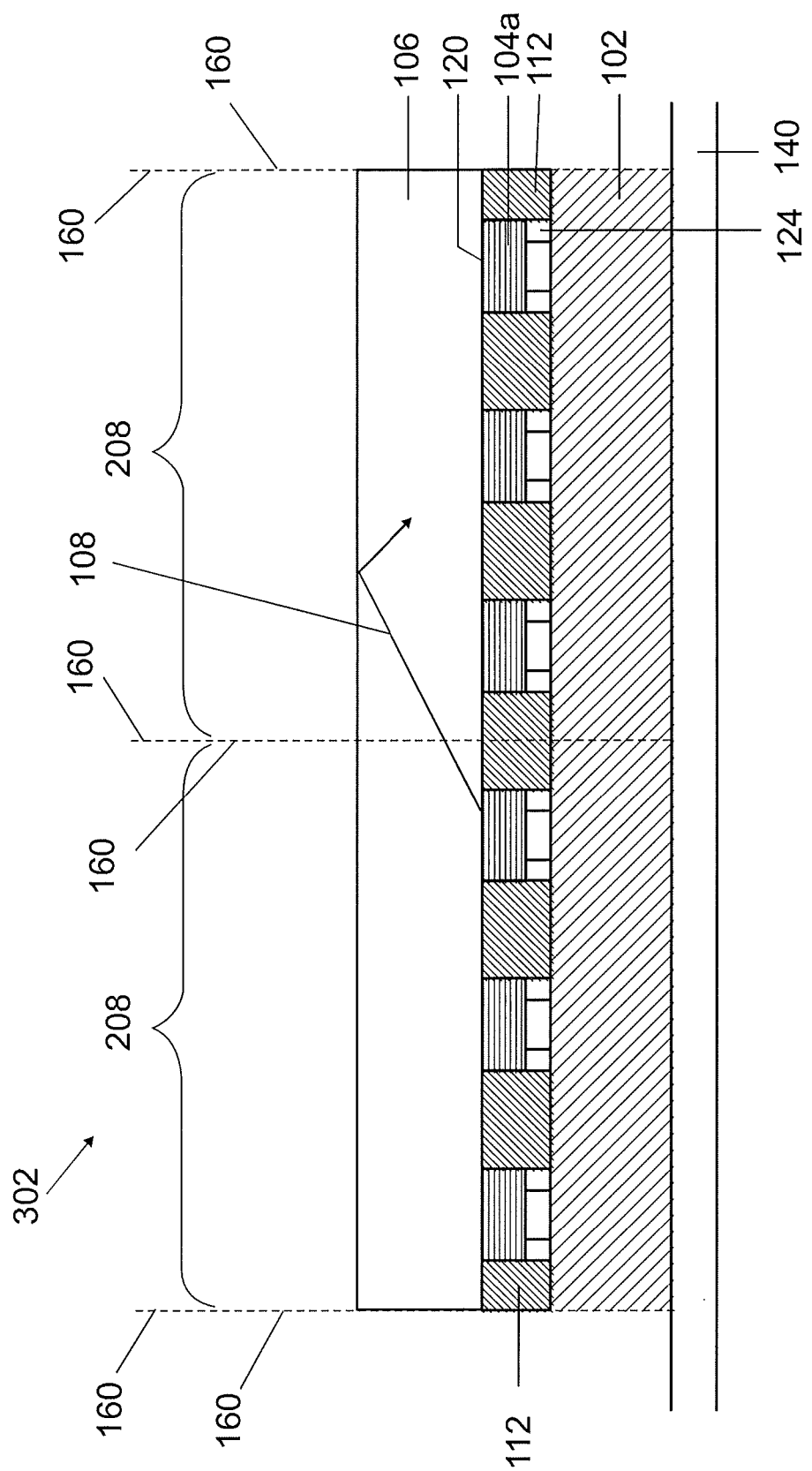
FIG. 5 shows an excerpt from a first example of a luminaire in a sectional view.

FIG. 5 shows an excerpt from a first example of a luminaire 302 in sectional view. Two partial luminaires 208 are joined to one another. For the purpose of fixing, the two partial luminaires 208 are arranged on a carrier 140. The elastic waveguides 106 of the two partial luminaires 208 are joined without any gaps at the separating location 160. In particular, the elastic waveguides 106 of the two partial luminaires 208 connect to one another in a manner free of adhesion promoter. A light path 108 is illustrated by way of example. The light 108 can cross the separating location 160 without experiencing a change in direction. In other words, no reflection and no refraction take place upon the transition of the light 108 from an elastic waveguide 106 to an adjacent elastic waveguide 106. The light "sees" no interface between the adjacent elastic waveguides 106. Chemical bonds can form between joined elastic waveguides 106. The separating location 160 is then no longer discernible as such. The waveguide of the luminaire, which waveguide is joined from partial luminaires 208 without any gaps, appears monolithic. Semiconductor chips 104a having a surface free of contacts are illustrated by way of example as semiconductor chips. These semiconductor chips 104a are particularly suitable for the simple arrangement of an elastic waveguide. It is possible to combine semiconductor chips 104a which emit electromagnetic radiation in the red, in the green and in the blue spectral range. This radiation can be intermixed in the elastic waveguide 106. The luminaire 302 can emit white light as a result. The effect of the intermixing of the radiation can be intensified by scattering particles (e.g., $TiO_2$ particles) being introduced into the waveguide.

Figure 6:
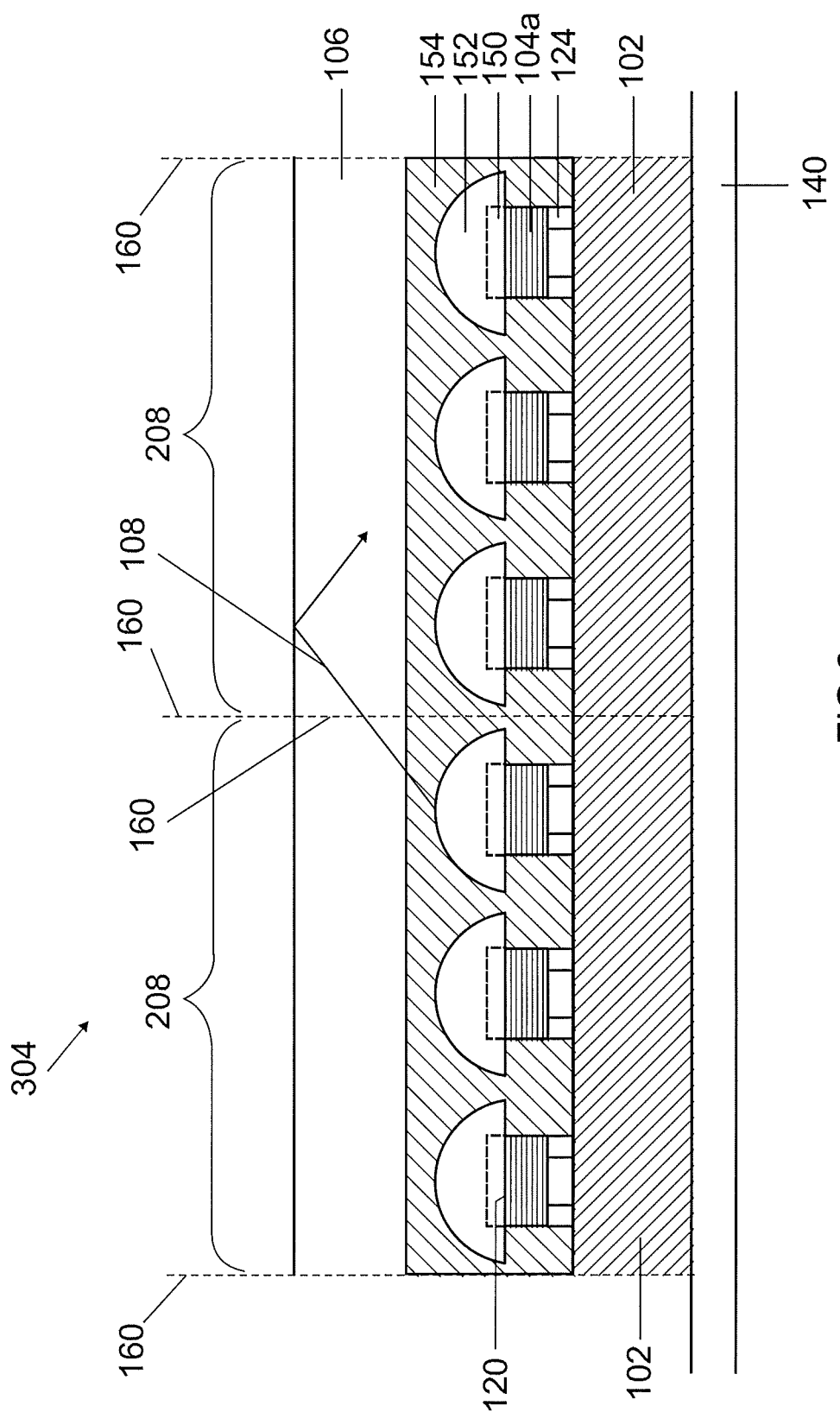
FIG. 6 shows an excerpt from a second example of a luminaire in a sectional view.

FIG. 6 shows an excerpt from a second example of a luminaire 304 in sectional view. Two partial luminaires 208 are joined to one another. Semiconductor chips 104a having an emission surface 120 free of contacts are arranged on the substrate 102. In contrast to the example in FIG. 5, a conversion element 150 for wavelength conversion is arranged on each semiconductor chip 104a. The conversion element 150 can be enclosed, for example, by a lens 152 for beam shaping. The combination of a semiconductor chip 104a that emits light in the blue spectral range and a conversion element 150 that converts part of the blue light into yellow light can produce a white light source. So that the elastic waveguide 106 can be disposed downstream of the semiconductor chips 104a covered with lenses 152, a clear potting 154 can be applied, for example. The clear potting 154 completely surrounds the semiconductor chips 104a and the lenses 152. During the curing of the clear potting 154, a planar surface forms, to which the elastic waveguide 106 can be fixed by a plasma process, for example. With regard to joining without any gaps and with regard to the light path 108, the present example corresponds to the example in FIG. 5.

Figure 7:
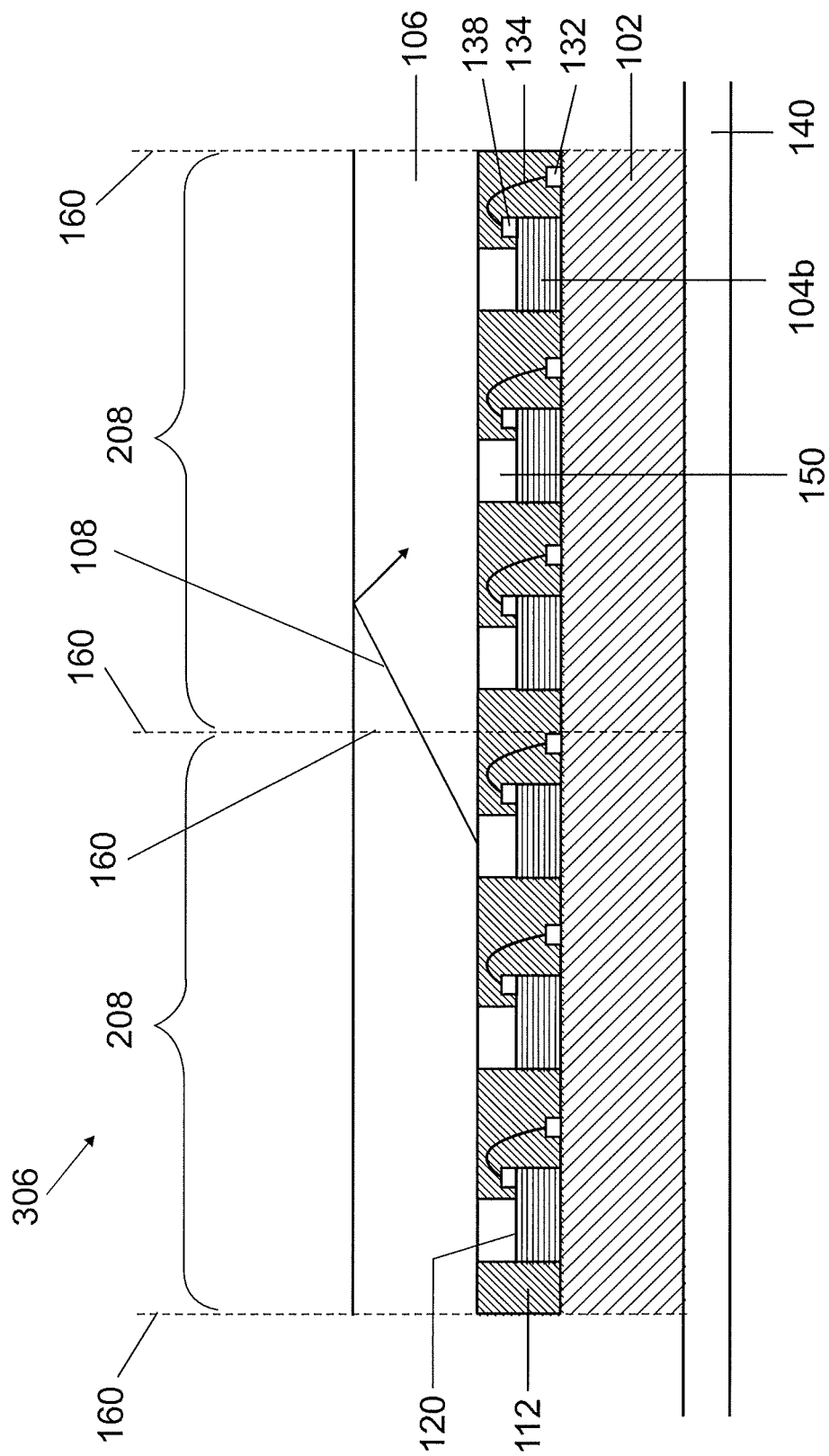
FIG. 7 shows an excerpt from a third example of a luminaire in a sectional view.

FIG. 7 shows an excerpt from a third example of a luminaire 306 in sectional view. Wire-bonded semiconductor chips 104b are illustrated as semiconductor chips. A conversion element 150 is arranged on the radiation emission side 120 of the semiconductor chip 104b. The conversion element 150 serves as a spacer for the elastic waveguide 106 disposed downstream and as means for the wavelength conversion of the electromagnetic radiation emitted by the semiconductor chip 104b. The conversion element 150 must be higher than the loop height 136 of the bonding wire 134 to serve as a spacer. By way of example, a silicone lamina or a ceramic lamina into which phosphor particles are introduced can be used as conversion element 150. The semiconductor chips 104b and the conversion elements 150 are surrounded with a scattering layer 112, for example, such that an approximately planar surface arises. An elastic waveguide 106 can be fixed on the scattering layer 112 and the conversion elements 150, for example, by a plasma process. With regard to joining without any gaps, this example corresponds to the example in FIG. 5.

Figure 8:
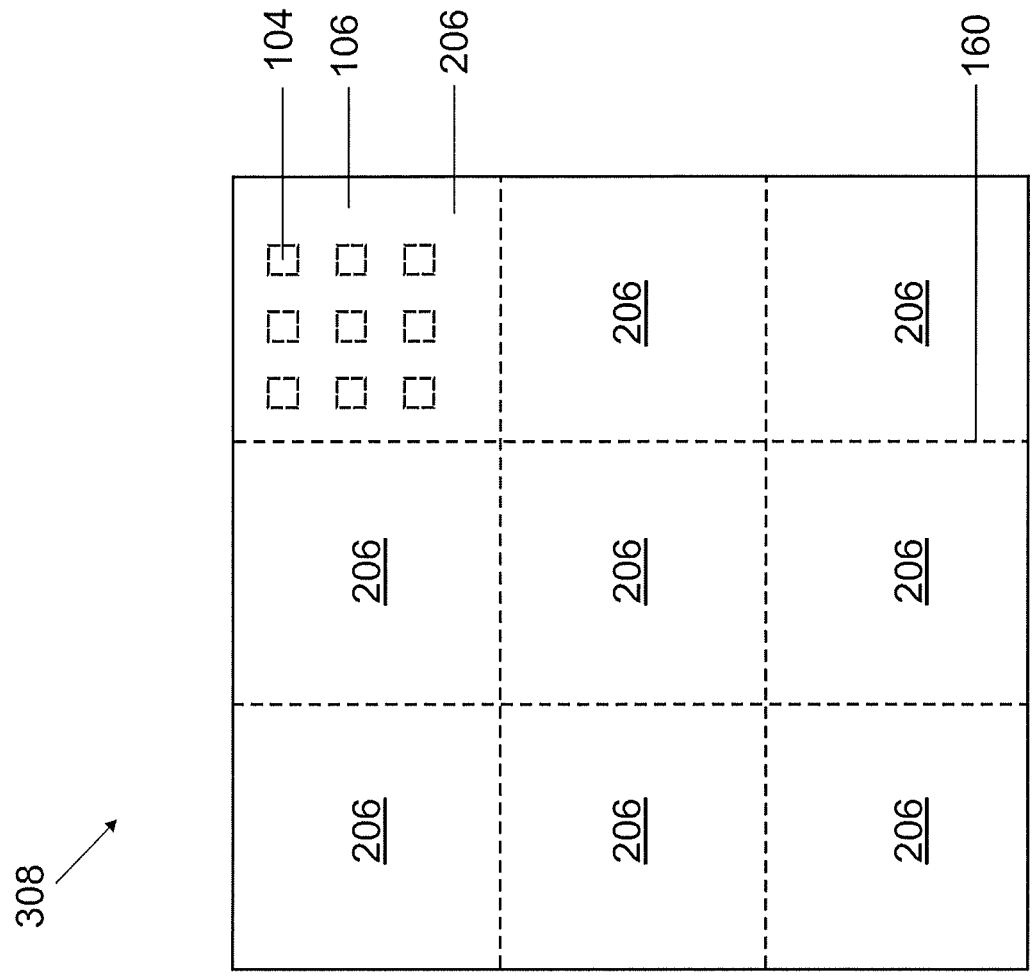
FIG. 8 shows a fourth example of a luminaire in plan view.

FIG. 8 shows a fourth example of a luminaire 308 in plan view. By way of example, nine square partial luminaires 206 are joined to one another without any gaps. A square luminaire 308 arises as a result of the joining process. By way of example, the partial luminaires 206 of the third example of the partial luminaire 206 are specified as partial luminaires. By way of example, nine semiconductor chips 104 are arranged regularly per partial luminaire 206. The semiconductor chips 104 are illustrated by dashed lines since they are concealed by the elastic waveguide 106.

Figure 9:
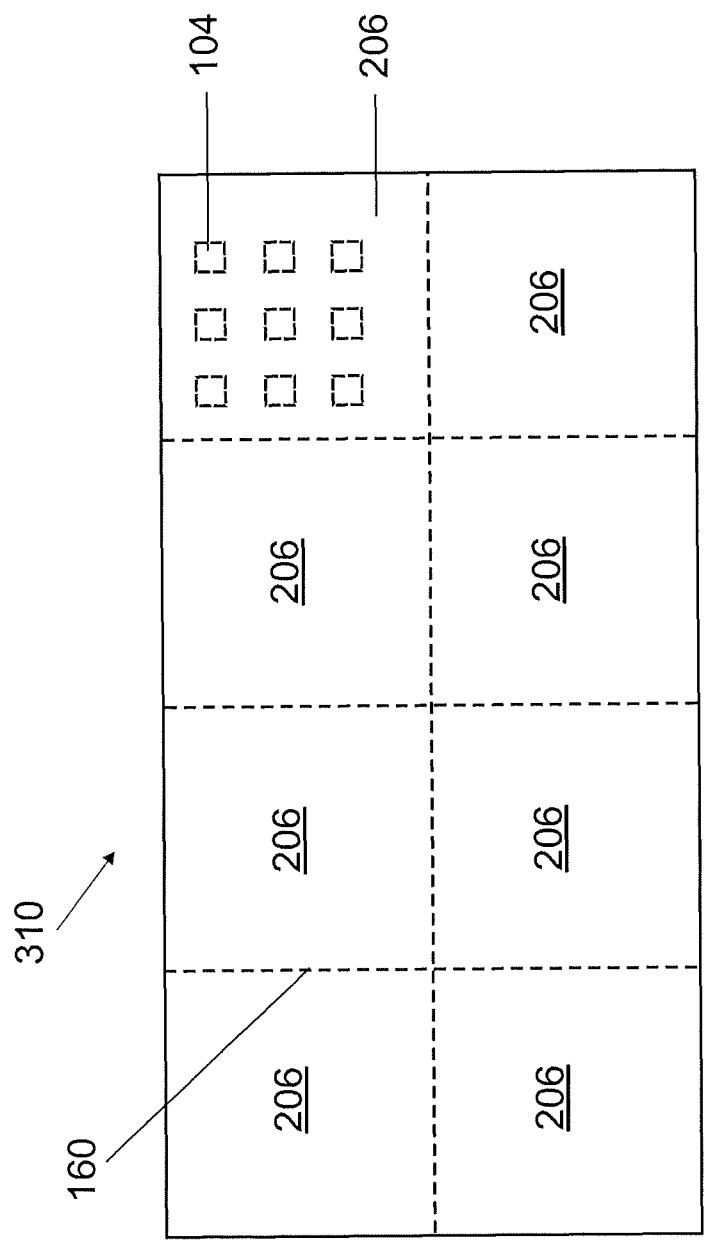
FIG. 9 shows a fifth example of a luminaire in plan view.

FIG. 9 shows a fifth example of a luminaire 310 in plan view. By way of example, eight square partial luminaires 206 are joined to one another without any gaps. A rectangular luminaire 310 arises as a result of the joining process.

The partial luminaires have the following sizes, for example:

20 mm×20 mm 80 mm×100 mm.

Alternatively, the partial luminaires can have a honeycomb shape or hexagonal shape, for example.

Besides arbitrarily shaped two-dimensional luminaires, three-dimensional luminaires, e.g., in a spherical shape or cylindrical shape, can also be formed from the partial luminaires.

The partial luminaire and the method of producing the partial luminaire, and the luminaire and the method of producing the luminaire have been described on the basis of examples to illustrate the underlying concept. In this case, the examples are not restricted to specific combinations of features. Even if some features and configurations have been described only in connection with a particular example or individual examples, they can be combined with other features from other examples. It is likewise possible, in examples, to omit or add individual illustrative features or particular configurations, insofar as the general technical teaching is still realized.

Even if the steps of the method of producing a partial luminaire, and for producing a luminaire are described in a specific order, nevertheless it goes without saying that each of the methods described in this disclosure can be carried out in any other expedient order, wherein method steps can also be omitted or added, insofar as no departure is made from the basic concept of the technical teaching described.

The invention claimed is:

1. A method of producing a partial luminaire comprising:
arranging at least one semiconductor chip that emits electromagnetic radiation on a substrate; and
applying an elastic waveguide, disposed downstream of the at least one semiconductor chip in an emission direction, such that the elastic waveguide projects at at least one of its side surfaces beyond the substrate, wherein the waveguide intermixes light reflected by total internal reflection at the side surfaces of the elastic waveguide and comprises a core composed of glass, polymethyl methacrylate (PMMA), polycarbonate (PC), or cycloolefin copolymers (COC), the core comprising a coating composed of polysiloxanes at least at the side surfaces, and said polysiloxanes have a modulus of elasticity of 0.2 MPa to 100 MPa.

2. The method according to claim 1, wherein the elastic waveguide projects at at least one of its side surfaces beyond the substrate by approximately 10 µm to approximately 100 µm.

3. The method according to claim 1, wherein applying the elastic waveguide comprises a plasma process or a molding process or an adhesive-bonding process.

4. The method according to claim 1, wherein applying the elastic waveguide is preceded by applying a scattering layer to the substrate around the at least one semiconductor chip, wherein applying the scattering layer comprises a plasma process or an adhesive-bonding process or a process of applying and curing a scattering potting.

5. A method of producing a luminaire comprising:
providing at least two partial luminaires produced according to claim 1, wherein the elastic waveguides of adjacent partial luminaires comprise an identical material system;
arranging the partial luminaires such that the elastic waveguides of adjacent partial luminaires touch one another at their side surfaces; and
pressing the partial luminaires onto one another such that the elastic waveguides of adjacent partial luminaires are joined without any gaps.

6. The method according to claim 5, wherein the partial luminaires are pressed onto one another at a lateral pressure of at most 100 Pa during a time duration of 10 ms to 10 s.

7. The method according to claim 5, wherein the partial luminaires are arranged on a carrier by a side of the substrate situated opposite the elastic waveguide, before the partial luminaires are pressed onto one another.

8. A partial luminaire comprising:
a substrate,
at least one semiconductor chip that emits electromagnetic radiation arranged on the substrate, and
an elastic waveguide that intermixes the electromagnetic radiation disposed downstream of the at least one semiconductor chip in an emission direction,
wherein the elastic waveguide projects at at least one of its side surfaces beyond the substrate, the elastic waveguide comprises a core composed of glass, polymethyl methacrylate (PMMA), polycarbonate (PC), or cycloolefin copolymers (COC), the core comprising a coating composed of polysiloxanes at least at the side surfaces, and the polysiloxanes have a modulus of elasticity of 0.2 MPa to 100 MPa.

9. The partial luminaire according to claim 8, wherein the elastic waveguide projects at at least one of its side surfaces beyond the substrate by approximately 10 µm to approximately 100 µm.

10. The partial luminaire according to claim 8, wherein the at least one side surface of the elastic waveguide is at an angle of approximately 80° to approximately 100° relative to a main extension direction of the substrate.

11. The partial luminaire according to claim 8, wherein the at least one side surface of the elastic waveguide is at an angle of approximately 85° to approximately 95° relative to a main extension direction of the substrate.

12. The partial luminaire according to claim 8, wherein the at least one side surface of the elastic waveguide is at an angle of approximately 90° relative to a main extension direction of the substrate.

13. The partial luminaire according to claim 8, wherein the elastic waveguide comprises crosslinked poly(organo)siloxanes, polysiloxanes for short, or silicones, wherein the polysiloxanes have a modulus of elasticity of 0.2 MPa to 100 MPa.

14. The partial luminaire according to claim 9, wherein the elastic waveguide comprises crosslinked poly(organo)siloxanes, polysiloxanes for short, or silicones, wherein the polysiloxanes have a modulus of elasticity of 0.5 MPa to 15 MPa.

15. The partial luminaire according to claim 13, wherein the polysiloxanes comprise at least one material selected from the group consisting of polydimethylsiloxane, polydiethylsiloxane and polyethylmethylsiloxane.

16. The partial luminaire according to claim 8, wherein the substrate is flexible and comprises polyimides (PI).

17. The partial luminaire according to claim 8, wherein the modulus of elasticity of said polysiloxanes is 0.5 MPa to 15 MPa.

18. A luminaire comprising at least two partial luminaires according to claim 8, wherein the elastic waveguides of adjacent partial luminaires are joined to one another without any gaps.

19. The luminaire according to claim 18, wherein the elastic waveguides of adjacent partial luminaires connect to one another in a manner free of adhesion promoter.

20. The luminaire according to claim 18, wherein the substrates of adjacent partial luminaires touch one another.

* * * * *